(12) United States Patent
Simmons

(10) Patent No.: US 8,253,706 B2
(45) Date of Patent: Aug. 28, 2012

(54) APPARATUS USING A DIFFERENTIAL ANALOG-TO-DIGITAL CONVERTER

(75) Inventor: Martin John Simmons, Hampshire (GB)

(73) Assignee: Atmel Corporation, San Jose, CA (US)

( * ) Notice: Subject to any disclaimer, the term of this patent is extended or adjusted under 35 U.S.C. 154(b) by 551 days.

(21) Appl. No.: 12/492,856

(22) Filed: Jun. 26, 2009

(65) Prior Publication Data

US 2010/0328226 A1    Dec. 30, 2010

(51) Int. Cl.
*G06F 3/045* (2006.01)

(52) U.S. Cl. .......................................... 345/173; 345/156

(58) Field of Classification Search ........... 345/156–173
See application file for complete search history.

(56) References Cited

U.S. PATENT DOCUMENTS

| | | | |
|---|---|---|---|
| 5,757,363 A * | 5/1998 | Oishi et al. ..................... | 345/173 |
| 5,805,147 A * | 9/1998 | Tokioka et al. ............... | 345/173 |
| 6,417,846 B1 * | 7/2002 | Lee .................................. | 345/173 |
| 6,452,514 B1 | 9/2002 | Philipp | |
| 7,532,202 B2 * | 5/2009 | Roberts ......................... | 345/173 |
| 7,663,607 B2 | 2/2010 | Hotelling | |
| 7,920,129 B2 | 4/2011 | Hotelling | |
| 8,031,094 B2 | 10/2011 | Hotelling | |
| 8,031,174 B2 | 10/2011 | Hamblin | |
| 8,031,180 B2 * | 10/2011 | Miyamoto et al. ............ | 345/173 |
| 8,049,732 B2 | 11/2011 | Hotelling | |
| 2002/0089491 A1 * | 7/2002 | Willig ............................ | 345/173 |
| 2003/0132902 A1 * | 7/2003 | Miyamoto ....................... | 345/87 |
| 2004/0217945 A1 * | 11/2004 | Miyamoto et al. ............ | 345/173 |
| 2009/0244014 A1 * | 10/2009 | Hotelling et al. .............. | 345/173 |
| 2010/0045635 A1 * | 2/2010 | Soo ................................ | 345/178 |
| 2010/0060589 A1 * | 3/2010 | Wilson ........................... | 345/173 |

\* cited by examiner

*Primary Examiner* — Nitin Patel

(74) *Attorney, Agent, or Firm* — Baker Botts L.L.P.

(57) ABSTRACT

Electronic apparatus and methods of operating the electronic apparatus include less than a frequency associated with a generated waveform. In various embodiments, an apparatus using a differential analog-to-digital converter can perform low frequency noise rejection that can be implemented in a variety of applications. Additional apparatus, systems, and methods are disclosed.

18 Claims, 2 Drawing Sheets

APPARATUS USING A DIFFERENTIAL ANALOG-TO-DIGITAL CONVERTER

BACKGROUND

Touch screens are widely being used in a variety of electronic devices and systems. Meeting the needs of consumers of such electronic devices and systems is driving the industry to provide touch screens with appropriately increased sensitivity and ease of use.

BRIEF DESCRIPTION OF THE DRAWINGS

Embodiments of the invention are illustrated by way of example and not limitation in the example figures of the accompanying drawings in which.

DETAILED DESCRIPTION

The following detailed description refers to the accompanying drawings that show, by way of illustration, various embodiments. These embodiments are described in sufficient detail to enable those skilled in the art to practice these and other embodiments. Other embodiments may be utilized, and structural, logical, and electrical changes may be made to these embodiments. Various embodiments are not necessarily mutually exclusive, as some embodiments can be combined with one or more other embodiments to form new embodiments. The following detailed description is, therefore, not to be taken in a limiting sense.

Figure 1:
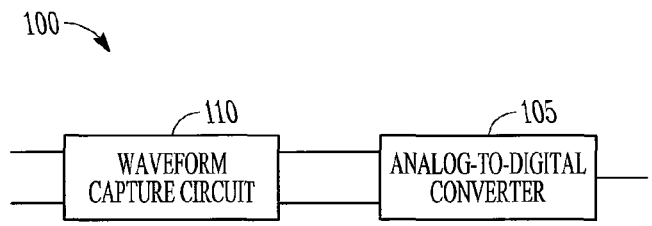
FIG. 1 illustrates a block diagram of an example embodiment of an apparatus using a differential analog-to-digital converter.

FIG. 1 illustrates a block diagram of an example embodiment of an apparatus 100 using a differential analog-to-digital converter (ADC) 105. Apparatus 100 also includes a waveform capture circuit 110. A waveform capture circuit provides a mechanism for acquiring characteristic features of a waveform. Such characteristics include, but are not limited to, a maximum amplitude, a minimum amplitude, a phase, or other features of the waveform. Waveform capture circuit 110 can be arranged to capture a characteristic of the waveform varying in one direction and an associated characteristic varying in a different direction. For example, waveform capture circuit 110 can acquire the maximum amplitude of a periodic waveform and the minimum amplitude of the same periodic waveform, where the maximum and minimum are associated with the same period. For example, waveform capture circuit 110 can acquire the rising edge of a pulse and the falling edge of a pulse and/or representations of the rising and falling edges. In various embodiments, waveform capture circuit 110 can acquire a response of a circuit component to the rising edge of an input pulse and the response of the circuit component to the falling edge of the input pulse and/or representations of these responses.

Waveform capture circuit 110 can be structured to manipulate waveforms to extract relevant information or representations of the waveforms. For example, a rising edge of a voltage pulse and a falling edge of the voltage pulse are correlated to a maximum voltage. Noise or low frequency interference concurrent with the pulse, or a response to the pulse, is typically common to the rising edge and the falling edge. Waveform capture circuit 110 can operate on the pulse, or a response to the pulse, to provide pulses of opposite polarity with associated common noise or low frequency interference of the same polarity. Subtraction of the two pulses effectively reduces or eliminates the associated common noise or low frequency interference and can double the dynamic range associated with the rising and falling edges of the pulse.

As shown in FIG. 1, ADC 105 is coupled to waveform capture circuit 110. ADC 105 can be configured with inputs coupled to waveform capture circuit 110 to receive a representation of a characteristic varying in the one direction and to receive a representation of an associated characteristic varying in the different direction. Differential ADC 105 can remove signal components common to both directions. In many instances such common components tend to be noise. With a waveform being a pulse, the characteristic varying in one direction can be a rising edge of the pulse and the associated characteristic varying in a different direction can be a falling edge of the pulse. With the waveform being an input pulse, the rising edge and falling edge applied to waveform capture circuit 110 can be responses to an input waveform to a circuit coupled to waveform capture circuit 110.

In various embodiments, waveform capture circuit 110 includes sample and hold circuits. The sample and hold circuits can be coupled to an amplifier such that waveform capture circuit 110 is arranged to provide a representation of a rising edge of a pulse and a representation of a falling edge of a pulse. The amplifier can be realized as a virtual earth amplifier.

Figure 2:
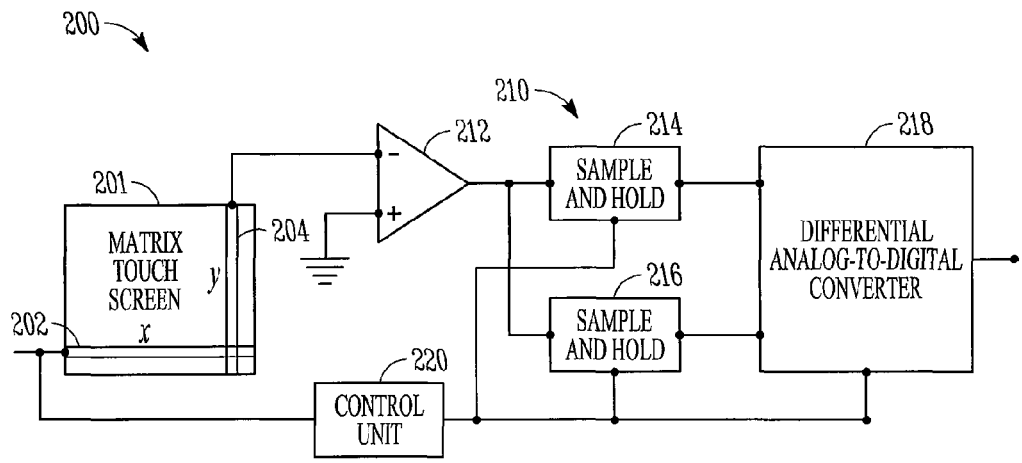
FIG. 2 shows a block diagram of features of an example embodiment of an apparatus having a matrix touch screen coupled to a circuit to measure charge transfer.

FIG. 2 shows a block diagram of features of an example embodiment of an apparatus 200 having a matrix touch screen 201 coupled to a circuit 210 to measure charge transfer. Matrix touch screen 201 includes drive electrodes 202, referred to as X lines or X electrodes, that are capacitively coupled to receive electrodes 204, referred to as Y lines or Y electrodes. For ease of discussion, only one X electrode 202 and one Y electrode 204 are shown. The X drive electrode 202 is separated form the Y electrode 204 by dielectric material. Without any disturbance in the physical arrangement, a signal received at Y electrode 204 in response to a signal applied to X electrode 202 is based on the capacitive coupling determined by the physical arrangement and the materials of the matrix touch screen 201. Contact with matrix touch screen 201, such as by human touch, alters the capacitive relationship between X electrode 202 and Y electrode 204, which affects charge transfer associated with a signal applied to X electrode 202. Charge transfer associated with the capacitive coupling between X electrode 202 and Y electrode 204 can be measured using circuit 210. In various embodiments, circuit 210 is configured to reject low frequency interference in the measurement of charge transfer associated with matrix touch screen 201. Circuit 210 can be arranged such that it is independent of the physical structure and design of matrix touch screen 201 and its components such as drive X electrodes 202 and receive Y electrodes 204. As a result, circuit 210 can be used with a variety of touch screens. Portions or all of circuit 210 can be integrated with matrix touch screen 201. Alternatively, portions or all of circuit 210 can be integrated with one or more other components separate from matrix touch screen 201.

In various example embodiments, circuit 210 includes an amplifier 212, a sample and hold circuit 214, a sample and hold circuit 216, and a differential analog-to-digital converter (ADC) 218. Amplifier 212 can be realized as a virtual earth amplifier. A virtual earth amplifier 212 can be used as a charge integration amplifier with respect to Y output line 204. Coupling differential ADC 218 to a virtual earth amplifier in circuit 210 to measure charge transfer provides a mechanism to reject low frequency interference during the measurement of the charge transfer associated with matrix touch screen 201.

As shown in FIG. 2, virtual earth amplifier 212 connected to Y line 204 on matrix touch screen 201 operatively collects charge and generates a negative voltage offset in response to a rising signal on X line 202 on matrix touch screen 201. The resulting voltage from virtual earth amplifier 212 can be held by sample and hold circuit 214 coupled to virtual earth amplifier 212. A maximum value of the resulting voltage in a particular direction can be held. Lowering the signal on the X line then results in a positive offset from virtual earth amplifier 212, which can be received and held in sample and hold circuit 216. For a pulse applied to X line 202, each edge of the pulse will produce a pulse in a particular direction out of virtual earth amplifier 212. A positive (rising) edge will produce a negative going pulse out of virtual earth amplifier 212 and a negative (falling) edge will produce a positive pulse out of virtual earth amplifier 212. Differential ADC 218, coupled to sample and hold circuit 214 and sample and hold circuit 216, operatively measures the difference between the two voltages associated with the rising signal and the falling signal on X line 202. Sample and hold circuits 214 and 216 are controlled to provide a mechanism for providing the positive and negative outputs from virtual earth amplifier 212 to differential ADC 218 substantially concurrently.

Circuit 210 can operatively perform charge collection on both edges of a pulse generated by X line 202. Charge collection on both edges of a pulse allows a doubling of the dynamic range for charge measurement at the output of the ADC 218. In addition, direct current (DC) offsets in measurement circuit 210 or interference at a frequency substantially lower than the frequency of a signal on X line 202 tend to cause an equal change in both halves of the measurement and can be removed when the differential measurement is taken at ADC 218.

Apparatus 200 can also include a control unit 220 to manage the charge measurement associated with pulses applied to X lines 202 of matrix touch screen 201 such that the measurement using the output of ADC 218 is synchronized. Control unit 220 can be configured to apply pulses to X lines 202. Alternatively, control unit 220 can be arranged to use and control measurement from pulse generation by another drive source.

By operating on the response to the dual edge of a waveform applied to the X input line 202 using the differential ADC 218, low frequencies of noise relative to the frequency of the waveform can be rejected. Using differential ADC 218 and dual edge charge transfer associated with a rising edge and a falling edge of a pulse can provide for low frequency noise rejection in charge measurement from a touch screen. In addition, differential ADC 218 can generate enhanced dynamic resolution to the charge measurement.

A charge measurement can be conducted with a pulse on an X line. Each pulse has a positive and a negative edge. A positive edge will generate a negative signal and a negative edge will generate a positive signal or visa versa, depending on the circuit. Sampling the signal from the positive edge, a signal from the measurement plus some value from low frequency interference is acquired. The signal with respect to the positive edge can be represented by $S_P = -M + L$, where M is the measurement and L is from the low frequency interference.

The signal with respect to the negative edge is acquired as $S_N = +M + L$.

Note that L will be the same for frequencies much slower than the measurement. With $S_P$ and $S_N$ fed into differential ADC 218, differential ADC 218 provides a measurement with the output of a signal given by $S_{ADC} = (+M+L) - (-M+L) = 2M$.

This ADC measurement can be viewed as being the same as subtracting the two edge-based signals during the conversion. As shown above, the architecture of circuit 210 can provide for the essential elimination of the low frequency noise, common to both edges of the pulse, while doubling the signal measurement.

Figure 3:
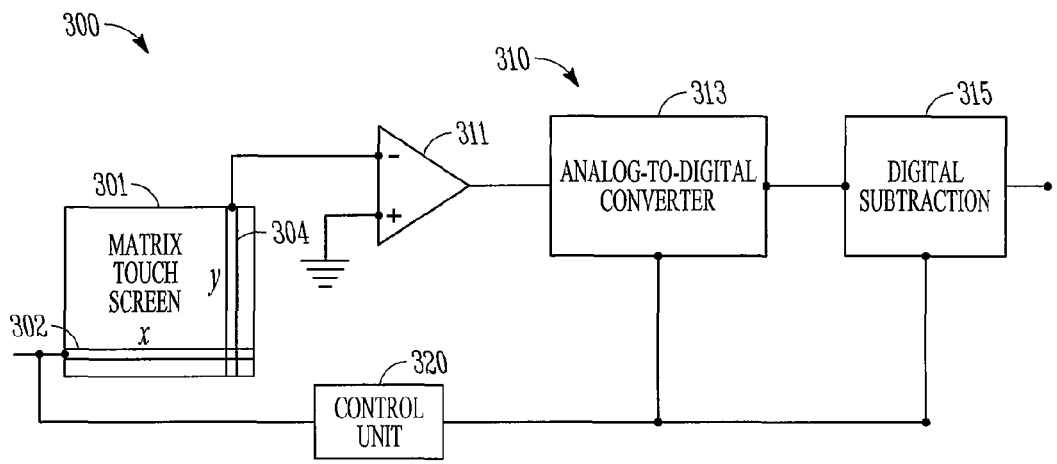
FIG. 3 shows a block diagram of features of an example embodiment of an apparatus having a matrix touch screen coupled to a circuit to measure charge transfer.

FIG. 3 shows a block diagram of features of an example embodiment of an apparatus 300 having a matrix touch screen 301 coupled to a circuit 310 to measure charge transfer. Matrix touch screen 301 includes drive electrodes 302 that are capacitively coupled to receive electrodes 304. For ease of discussion, only one X electrode 302 and one Y electrode 304 are shown, similar to the discussion with respect to FIG. 2. Similar to apparatus 200 of FIG. 2, operation of matrix touch screen 301 is based on capacitive coupling between X drive lines 302 and Y output lines 304. Charge transfer associated with the capacitive coupling between X line 302 and Y line 304 can be measured using circuit 310. Circuit 310 can be arranged such that it is independent of the physical structure and design of matrix touch screen 301 and its components such as drive X electrodes 302 and receive Y electrodes 304. As a result, circuit 310 can be used with a variety of touch screens. Portions or all of circuit 310 can be integrated with matrix touch screen 301. Alternatively, portions or all of circuit 310 can be integrated with one or more other components separate from matrix touch screen 301.

In various example embodiments, circuit 310 includes an amplifier 311, an analog-to-digital converter (ADC) 313, and a digital subtraction unit 315. Amplifier 311 can be realized as a virtual earth amplifier. A virtual earth amplifier 311 can be used as a charge integration amplifier with respect to Y output line 304. In operation, virtual earth amplifier 311 connected to Y line 304 on matrix touch screen 301 operatively collects charge and generates a negative voltage offset in response to a rising signal on X line 302 on matrix touch screen 301. The resulting voltage from virtual earth amplifier 311 can be sent directly to ADC 313. Lowering the signal on the X line then results in a positive offset from virtual earth amplifier 311, which can be sent directly to ADC 313. ADC 313 provides, to digital subtraction unit 315, digital representations of the two voltages received from virtual earth amplifier 311. Digital subtraction unit 315 can be realized in a number of conventional or equivalent formats. Output of digital subtraction unit 315 is used in the measurement of charge transfer associated with a signal driven on X input line 302 capacitively coupled to receive Y line 304 of matrix touch screen 301. Circuit 310 can operatively perform charge collection on both edges of a pulse generated at X line 302 in which digital subtraction provides for low frequency rejection in the charge measurement.

Apparatus 300 can also include a control unit 320 to manage the charge measurement associated with pulses applied to X lines 302 of matrix touch screen 301 such that the measurement using the output of ADC 313 is synchronized. Control unit 320 can be configured to apply pulses to X lines 302. Alternatively, control unit 320 can be arranged to use and control measurement from pulse generation by another drive source.

Circuit 210 of FIG. 2 effectively uses subtraction in analog format. Circuit 310 of FIG. 3, on the other hand, conducts subtraction in a digital format. In various embodiments, use of sample and hold circuits with a differential analog-to-digital converter similar to the example shown in FIG. 2 can provide better resolution than embodiments using digital subtraction similar to the example shown in FIG. 3.

Figure 4:
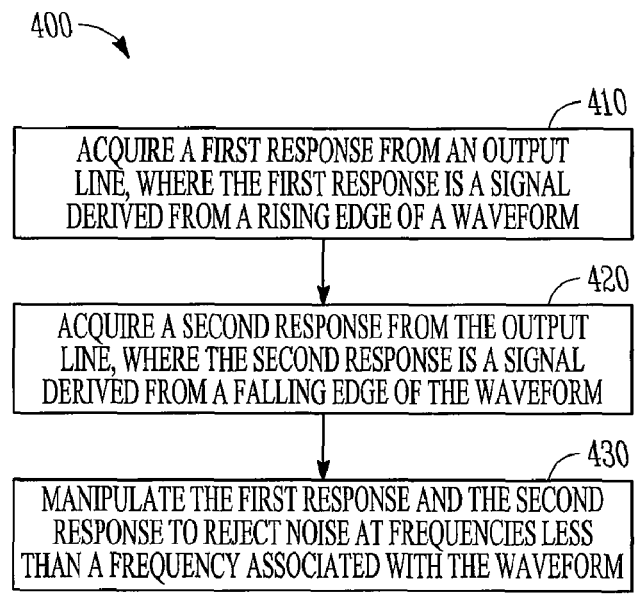
FIG. 4 shows features of an example embodiment of a method for low frequency noise rejection.

FIG. 4 shows features of an example embodiment of a method for low frequency noise rejection. At 410, a first response is acquired from an output line, where the first response is a signal derived from a rising edge of a waveform. The first response can be acquired from an output line of a matrix touch screen, where the first response includes a capacitively induced signal derived from a rising edge of a pulse applied to an input line of the matrix touch screen.

At 420, a second response is acquired from the output line, where the second response is a signal derived from a falling edge of the waveform. The second response can be acquired from the output line of the matrix touch screen, where the second response includes a capacitively induced signal derived from a falling edge of the pulse applied to the input line of the matrix touch screen.

At 430, the first response and the second response are manipulated to reject noise at frequencies less than a frequency associated with the waveform. Manipulation of the first response and the second response can be applied with respect to a pulse applied to the input line of the matrix touch screen such as to reject noise at frequencies less than a frequency associated with the pulse. Such manipulation can include a subtraction between a digital representation of the first response and a digital representation of the second response. Other manipulations can include applying the first response and the second response to sample and hold circuits and applying outputs from the sample and hold circuits to a differential analog-to-digital converter such that an output of the differential analog-to-digital converter includes a measure of charge associated with the first and second responses. The first response and the second response can be coupled to the sample and hold circuits through a virtual earth amplifier. With the first response corresponding to a rising edge of the pulse and the second response corresponding to a falling edge of the pulse, the virtual earth amplifier outputs a negative pulse and a positive pulse, respectively, to the sample and hold circuits. Noise common to the rising edge and falling edge of the pulse can be removed by applying the outputs of the sample and hold circuits to a differential analog-to-digital converter.

Figure 5:
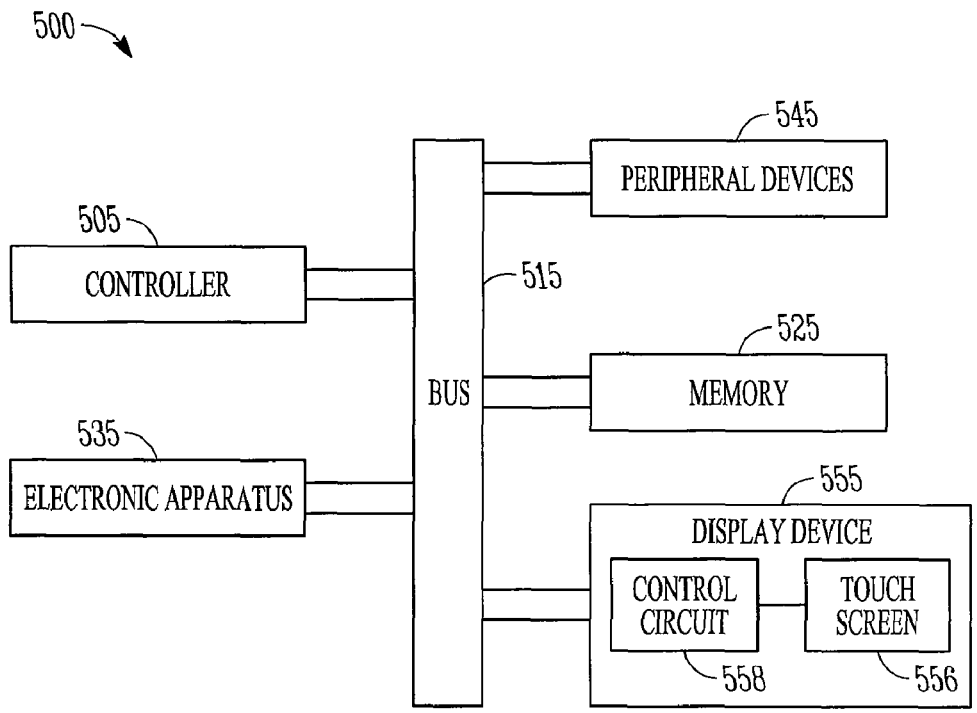
FIG. 5 shows a block diagram of a system having a controller and an apparatus including a touch screen and a circuit having an analog-to-digital converter for charge measurements in operation of the touch screen.

FIG. 5 shows a block diagram of a system 500 having a controller 505 and an apparatus, such as display device 555, including a touch screen 556 and a control circuit 558 having an analog-to-digital converter for charge measurements in operation of touch screen 556. The analog-to-digital converter can be configured with other circuit components to provide low frequency noise rejection in charge measurements from operation of touch screen 556. Touch screen 556 and control circuit 558 can be arranged according to various embodiments similar to or identical to those described herein. Controller 505 can be realized as a processor.

System 500 can be formed in various manners coupling the individual components of system 500 together or integrating the components into one or a number of units using conventional techniques. In various embodiments, system 500 also includes an electronic apparatus 535 and a bus 515. Bus 515 provides electrical conductivity between controller 505 and electronic apparatus 535, between controller 505 and a memory 525, and among the various components coupled to bus 515. In an embodiment, bus 515 includes an address bus, a data bus, and a control bus, each independently configured. In an alternative embodiment, bus 515 uses common conductive lines for providing one or more of address, data, or control, the use of which is regulated by controller 505. In various embodiment, memory 525 can include one or more memory types, such as but not limited to, a DRAM (Dynamic Random Access Memory), SRAM (Static Random Access Memory), flash memories, magnetic memories, other memory formats, and combinations thereof.

In various embodiments, additional peripheral device or devices 545 are coupled to bus 515. Peripheral devices 545 can include displays, imaging devices, printing devices, wireless devices, additional storage memory, control devices that can operate in conjunction with controller 505.

In various embodiments, system 500 includes display device 555 having touch screen 556 and control circuit 555, where control circuit 555 has an analog-to-digital converter configured for charge measurements from operation of the touch screen. Alternatively, control circuit 555 can be integrated with controller 505 or one or more other components of system 500 separate from touch screen 556. System 500 having a display device 555 includes, but is not limited to, fiber optic systems or devices, electro-optic systems or devices, optical systems or devices, imaging systems or devices, and information handling systems or devices such as wireless systems or devices, telecommunication systems or devices, and computers.

Although specific embodiments have been illustrated and described herein, it will be appreciated by those of ordinary skill in the art that any arrangement that is calculated to achieve the same purpose may be substituted for the specific embodiments shown. Various embodiments use permutations and/or combinations of embodiments described herein. It is to be understood that the above description is intended to be illustrative, and not restrictive, and that the phraseology or terminology employed herein is for the purpose of description.

What is claimed is:

1. A method comprising:
acquiring a first response from an output line of a matrix touch screen, the first response being a capacitively induced signal derived from a rising edge of a pulse applied to an input line of the matrix touch screen;
acquiring a second response from the output line of the matrix touch screen, the second response being a capacitively induced signal derived from a falling edge of the pulse applied to the input line of the matrix touch screen; and
manipulating the first response and the second response to reject noise at frequencies less than a frequency associated with the pulse.

2. The method of claim 1, wherein manipulating the first response and the second response includes a subtraction between a digital representation of the first response and a digital representation of the second response.

3. The method of claim 2, where the subtraction between the digital representation of the first response and the digital representation of the second response is performed by a digital subtraction unit.

4. The method of claim 1, wherein manipulating the first response and the second response includes:
applying the first response and the second response to sample and hold circuits;
applying outputs from the sample and hold circuits to a differential analog-to-digital converter such that an output of the differential analog-to-digital converter includes a measure of charge associated with the first and second responses.

5. The method of claim 4, wherein applying outputs from the sample and hold circuits to the differential analog-to-digital converter includes applying two voltages to the differential analog-to-digital from the sample and hold circuits.

6. The method of claim 4, wherein the measure of charge associated with the first and second responses comprises $S_N - S_P$, the first response represented by a positive edge $S_P$, where $S_P = -M + L$, and the second response represented by a negative edge $S_N$, where $S_N = +M + L$, where M is a measurement and L is a low frequency interference.

7. The method of claim 1, wherein manipulating the first response and the second response comprises:
applying the first and second response to an analog-to-digital converter such that an output of the analog-to-digital converter includes a first digital representation of the first response and a second digital representation of the second response; and
applying the output from the analog-to-digital converter to a digital subtraction unit such that an output of the digital subtraction unit includes a measure of charge associated with the first and second responses based on a subtraction between the first digital representation of the first response and the second digital representation of the second response.

8. An apparatus comprising:
a waveform capture circuit configured to:
capture a response to a pulse having a characteristic varying in one direction, the characteristic varying in the one direction comprising a rising edge of the response to the pulse; and
capture an associated characteristic varying in a different direction, the associated characteristic varying in the different direction comprising a falling edge of the response to the pulse; and
a differential analog-to-digital converter coupled to the waveform capture circuit, the differential analog-to-digital converter having inputs to receive a representation of the characteristic varying in the one direction and to receive a representation of the associated characteristic varying in the different direction.

9. The apparatus of claim 8, wherein the waveform capture circuit includes a sample and hold circuit.

10. The apparatus of claim 8, wherein the waveform capture circuit includes an amplifier coupled to two sample and hold circuits, the waveform capture circuit arranged to provide a representation of the rising edge of the pulse and a representation of the falling edge of the pulse.

11. The apparatus of claim 10, wherein the amplifier includes a virtual earth amplifier.

12. The system of claim 10, wherein the system comprises a control circuit configured to synchronize generation of the pulse with operation of the two sample and hold circuits.

13. A system comprising:
a matrix touch screen having an input line and an output line, the output line configured with respect to the input line to acquire a capacitively induced signal derived from a pulse applied to the input line of the matrix touch screen;
a waveform capture circuit configured to capture characteristics of the capacitively induced signal including a characteristic varying in one direction, the characteristic varying in the one direction comprising a rising edge of a response to the pulse, and an associated characteristic varying in a different direction, the associated characteristic varying in the different direction comprising a falling edge of the response to the pulse; and
a differential analog-to-digital converter coupled to the waveform capture circuit, the differential analog-to-digital converter having inputs to receive a representation of the characteristic varying in the one direction and to receive a representation of the associated characteristic varying in the different direction.

14. The system of claim 13, wherein the waveform capture circuit includes a sample and hold circuit.

15. The system of claim 13, wherein the waveform capture circuit includes a virtual earth amplifier coupled to the output line to receive the capacitively induced signal and coupled to two sample and hold circuits to send a representation of the rising edge of the pulse and a representation of the falling edge of the pulse to the two sample and hold circuits.

16. The system of claim 15, wherein the two sample and hold circuits are coupled to the differential analog-to-digital converter.

17. The system of claim 15, wherein the system includes a control circuit to synchronize generation of the pulse with operation of the two sample and hold circuits.

18. The system of claim 13, wherein the differential analog-to-digital converter is configured with the waveform capture circuit such that the differential analog-to-digital converter operatively removes DC offsets from measurement of charge from the capacitively induced signal.

* * * * *